United States Patent [19]

D'Altroy et al.

[11] 4,130,827

[45] Dec. 19, 1978

[54] INTEGRATED CIRCUIT SWITCHING NETWORK USING LOW SUBSTRATE LEAKAGE CURRENT THYRISTOR CONSTRUCTION

[75] Inventors: Frederick A. D'Altroy, Center Valley, Pa.; Adrian R. Hartman, Westfield, N.J.; Richard M. Jacobs, Allentown; Robert L. Pritchett, Bath, both of Pa.; Peter W. Shackle, Bridgewater, N.J.

[73] Assignee: Bell Telephone Laboratories, Incorporated, Murray Hill, N.J.

[21] Appl. No.: 747,366

[22] Filed: Dec. 3, 1976

[51] Int. Cl.² .......................................... H01L 29/74
[52] U.S. Cl. ...................................... 357/38; 357/44; 357/45; 357/51; 357/64; 357/91
[58] Field of Search ....................... 357/38, 64, 44, 45, 357/51, 91

[56] References Cited

U.S. PATENT DOCUMENTS

| 3,441,815 | 4/1969 | Pollock et al. | 357/64 |
| 3,640,783 | 2/1972 | Bailey | 357/64 |
| 3,786,425 | 1/1974 | Hetherington et al. | 357/38 |
| 3,872,493 | 3/1975 | Roberts et al. | 357/38 |

Primary Examiner—Joseph E. Clawson, Jr.
Attorney, Agent, or Firm—Irwin Ostroff; Arthur J. Torsiglieri

[57] ABSTRACT

A semiconductor junction-isolated PNPN crosspoint switch array has a plurality of crosspoint switches that are each formed of four regions of alternating conductivity type in a semiconductor substrate. Low enough leakage to allow the crosspoint switch array to be used in large telephone switching systems is achieved by proper selection of the thickness of the semiconductor regions and by appropriate gold doping thereof.

9 Claims, 4 Drawing Figures

INTEGRATED CIRCUIT SWITCHING NETWORK USING LOW SUBSTRATE LEAKAGE CURRENT THYRISTOR CONSTRUCTION

BACKGROUND OF THE INVENTION

This invention relates to semiconductor circuits comprising a plurality of successive regions of alternating conductivity types, and in particular, to a low leakage junction isolated four-region semiconductor crosspoint switching structure useful in telephone switching systems.

Arrays of Silicon Controlled Rectifiers (SCRs), which are characterized by a low impedance "conducting" state ("on" state) and a high impedance "blocking" state ("off" state, "nonconducting" state) have been suggested as replacements for mechanical relays in telephone switching systems. A PNPN structure fabricated in a p-type silicon substrate can be operated as an SCR.

U.S. Pat. No. 3,786,425, in which there is a common assignee with the present patent application and one common inventor, illustrates a PNPN semiconductor structure consisting of four alternating conductivity type regions in a semiconductor substrate. One of the problems of this structure is that the leakage into the substrate is too high to tolerate in large telephone switching systems.

British Pat. No. 1,427,261 describes a semiconductor crosspoint switch structure having five alternating conductivity type regions contained within a semiconductor substrate. The structure disclosed solves many of the leakage problems of prior art structures; however, the disclosed structure requires an extra semiconductor region which complicates the fabrication process and increases the physical size of the structure.

It would be desirable to have a semiconductor crosspoint structure which comprises four regions of alternate conductivity type in a semiconductor substrate and has relatively low leakage into the substrate.

SUMMARY OF THE INVENTION

One embodiment of the present invention is a semiconductor junction isolated crosspoint switch comprising four semiconductor regions of alternate conductivity type within a semiconductor substrate. In an illustrative embodiment the switch is a PNPN type semiconductor structure with the substrate of p-type conductivity; the first, second, third and fourth regions are n+, p, n, and p+ type conductivity, respectively. In operation, an input signal applied to the fourth (first) region propagates through the third, second and first (fourth) regions. The first and fourth regions are adapted to serve as the input/output terminals.

The first region is typically a deep n+ buried region in the substrate which has a portion which extends to the surface of a p-type epitaxial layer which is grown on the surface of the substrate. The portion of the first region extending through the p-epitaxial layer encircles and thereby isolates a portion of the p-epitaxial layer which becomes the second region of the switch. The second region has an exposed portion at the planar surface of the substrate. The n-type third region is formed in part of the second region and is surrounded by the second region on four sides and the bottom. The third region has an exposed surface portion at the planar surface of the substrate. The p+ type fourth region is formed in part of the third region and is completely surrounded on four sides and the bottom by the third region. The fourth region has an exposed portion at the planar surface of the substrate. The exposed portions of at least the first, third, and fourth regions are adapted to facilitate separate electrical contacts thereto.

The first region is designed to have sufficient vertical thickness and impurity concentration such that there exists enough naturally occurring recombination centers to cause many carriers injected therein from the second region to recombine therein. This limits the numbers of carriers that enter into the substrate as leakage. Additional recombination centers are either added to or caused to come into existence in the first region. One preferred method of adding recombination centers is to add gold atoms to the first region. These additional gold recombination centers are significantly more effective than those naturally occurring in the first region. Accordingly, the rate of recombination of carriers injected into the first region from the second region is significantly increased and, accordingly, leakage into the substrate is significantly reduced.

In a further improvement of the above-described invention, recombination centers, in addition to those naturally occurring in the second region, are either added to or caused to come into existence in the second region. One preferred method of adding recombination centers is to add gold atoms to the second region. This increases recombination in the second region and therefore reduces the number of carriers which exit the second region and enter the first region. Thus the leakage of carriers from the first region into the substrate is reduced.

One preferred embodiment of the present invention is a semiconductor array of rows and columns of interconnected PNPN type three terminal crosspoint switches. Each switch comprises a semiconductor junction-isolated four region device of the type discussed above and in addition comprises a junction-isolated three region device. Each switch has the electrical characteristics of an SCR.

Each three region device comprises an n+ type first region in the same semiconductor p-type substrate and p-type epitaxial layer as the four region device with a p-type second region contained within part of the first region thereof and surrounded by the first region on four sides and the bottom, and an n-type third region contained within part of the second region and surrounded by the second region on four sides and the bottom. The first, second, and third regions of the three region device all have exposed portions at the planar surface of the substrate.

The first regions of the three and four region devices both are junction-isolated from each other by a p-type region which at least comprises part of the common semiconductor substrate.

The first region of each four region device comprises recombination centers in addition to those which naturally occur therein. In a further improvement of the present invention the second region of each four region device contains recombination centers in addition to those which naturally occur therein.

The first regions of the four region and three region devices are adapted to serve as the first and third terminals of each switch. The fourth region of the four region device is adapted to serve as the second terminal of each switch. The third region of the three region device defines a resistive element which is electrically coupled by one end to the third region of the four region device and is electrically coupled by the other end to the fourth region of the four region device.

Each of the above-described crosspoint switches of the array limits the leakage of current into the substrate because of the dimensions selected for the first and second regions of the four region device and because of the additional recombination centers which are added to the first and second regions of the four region device. One preferred method of creating these additional recombination centers is to introduce gold atoms into the desired regions. Gold atoms are known to be significantly more effective in causing recombination than naturally occurring recombination centers, and accordingly, potential leakage currents originating in the first and second regions of the four region device recombine within the respective regions and accordingly substantially reduce leakage into the substrate.

These and other features of the invention will be better understood from a consideration of the following detailed description taken in conjunction with the following drawings.

DETAILED DESCRIPTION

Figure 1:
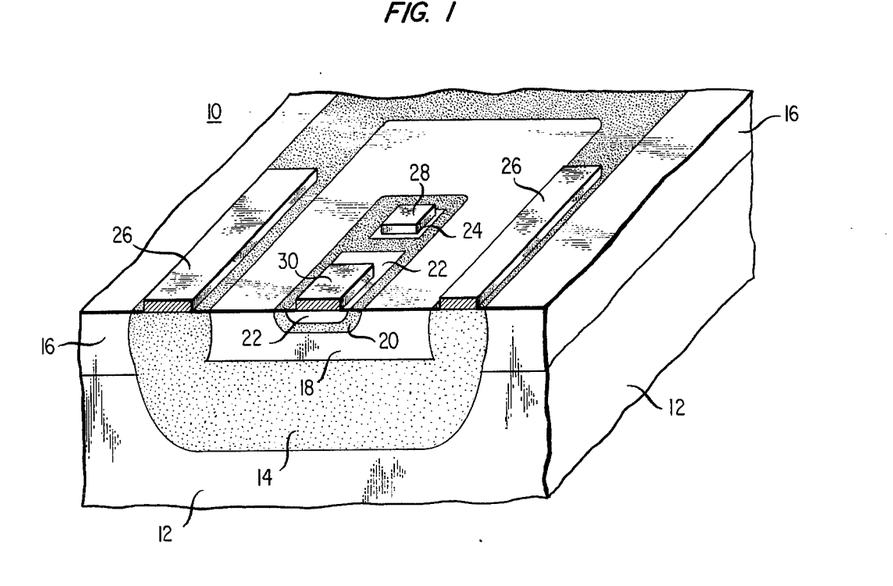
FIG. 1 illustrates in perspective a front cross section view of a semiconductor structure in accordance with the present invention.

Referring now to FIG. 1 there is illustrated in a perspective cross section view a semiconductor switching structure 10 comprising a p-type silicon substrate 12 comprising an n+ type longitudinal region 14. Region 14 is fabricated using a two step process. First, n-type impurities are ion implanted and then diffused into substrate 12 to form an n+ region and then substrate 12 is overlaid with a grown p-type epitaxial region 16. Next, n-type impurities are selectively deposited on the p-type epitaxial region 16 and then diffused to penetrate region 16 to leave the original n+ type region as a buried region with an isolated p-type region 18 surrounded by n+ type region 14. Region 14 completely surrounds region 18 on four sides and the bottom. A second n-type region, region 20, is ion implanted in part of region 18. An n+ type region 24 is ion implanted in a portion of region 20. A layer of gold (not illustrated), typically 500-2000 Angstroms thick, is now applied to the back of substrate 12 and then a second p-type region 22 is deposited and diffused into part of region 20. The substrate 12 is now subjected to a high temperature of typically 1100°-1150° C. and then quickly cooled to room temperature. This is known as a gold spike process which serves to place the gold atoms in crystalline sites formerly occupied by silicon atoms in all regions of structure 10. Electrical contacts 26, 28 and 30 are then made to regions 14, 24 and 22, respectively.

Typically the thicknesses of regions 14, 18, 20, and 22 are 6-20 microns, 3-9 microns, 1-2 microns, and 1-3 microns, respectively. It is desirable that region 14 be as thick and heavily doped as reasonably possible to allow carriers entering therein to have sufficient time to recombine such that there is relatively low leakage of carriers into substrate 12. It is also desirable that region 18 be reasonably thick so as to allow some of the carriers existing therein to have sufficient time to recombine and thereby limit the number of carriers which travel from region 18 through region 14 and then into substrate 12 as leakage. The above-described gold doping causes a large number of gold atoms to take positions within n+ region 14 because n+ type regions have an affinity for collecting gold atoms. The gold atoms in region 14 are significantly more effective recombination centers than those recombination centers which naturally occur in region 14. The additional highly effective recombination centers significantly increase recombination of carriers in region 14 and thereby significantly further reduce leakage into the substrate.

It has been found that with no gold doping of any regions and relatively high current densities on the order of $10^3 A/cm^2$, that the leakage currents into the substrate are much higher than one might expect from the impurity doping levels used in regions 12, 14, and 18. It is believed that the high current densities in region 18 cause a plasma of carriers of equal numbers of holes and electrons to be created in region 18 due to the effect known as conductivity modulation. The net excess of the number of the holes over the number of electrons in region 18 remains as it should be as a function of the impurity concentration thereof; however, once this plasma of charges reaches the n+ type region 14 the holes of the plasma diffuse across region 14 and reach the junction between region 14 and substrate 12 and are collected by the substrate 12 as leakage. The electrons of the plasma tend to be repelled by region 14 and drift into region 20.

It is believed that the gold doping of region 18 causes the high current induced plasma of carriers to recombine in region 18 and thereby significantly reduces this plasma. Accordingly, the numbers of carriers available to diffuse through region 14 into the substrate 12 as leakage are significantly reduced. The gold doping of both regions 14 and 18 thus very significantly reduces leakage into the substrate 12.

Figure 2:
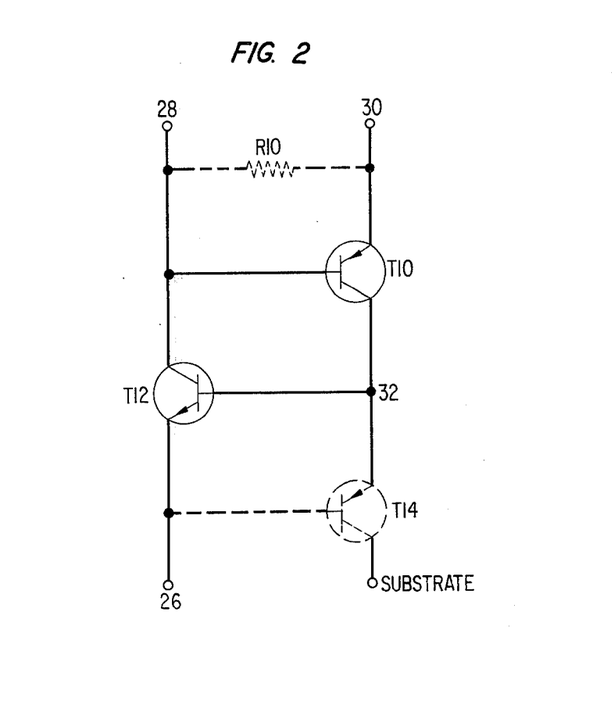
FIG. 2 illustrates an equivalent electrical circuit of the semiconductor structure illustrated in FIG. 1.

Referring now to FIG. 2 there is illustrated an equivalent electrical circuit of the semiconductor switching structure 10 illustrated in FIG. 1 which comprises a p-n-p transistor T10, an n-p-n transistor T12 and a parasitic transistor T14 (illustrated in dashed lines — the semiconductor substrate serving as the collector). Contact terminal 26 is connected to the emitter of T12 and the base of T14. Contact terminal 28 is connected to the base of T10 and to the collector of T12. Contact terminal 30 is connected to the emitter of T10. The collector of T10, the base of T12, and the emitter of T14 are all connected together to node 32.

Switch 10 of FIG. 1 functions as an SCR with terminals 26, 28, and 30 serving as the cathode, gate, and anode terminals, respectively. A resistor R10, illustrated in dashed lines, can be connected between terminals 28 and 30 to allow better control of the gate trigger current at which switch 10 switches to a conducting state from a blocking state and to provide better control over the minimum current that must flow through switch 10 to maintain it in the conducting state.

The leakage of signals applied to terminals 26 or 30 into the substrate 12 degrades the performance of telephone switching systems. The gold doping of region 18, (which serves as the base of T12, the collector of T10, and the emitter of T14) and of region 14, (which serves as the emitter of T12 and the base of T14) and the proper selection of the thicknesses of regions 14 and 18 serve to significantly limit leakage into the substrate.

Figure 3:
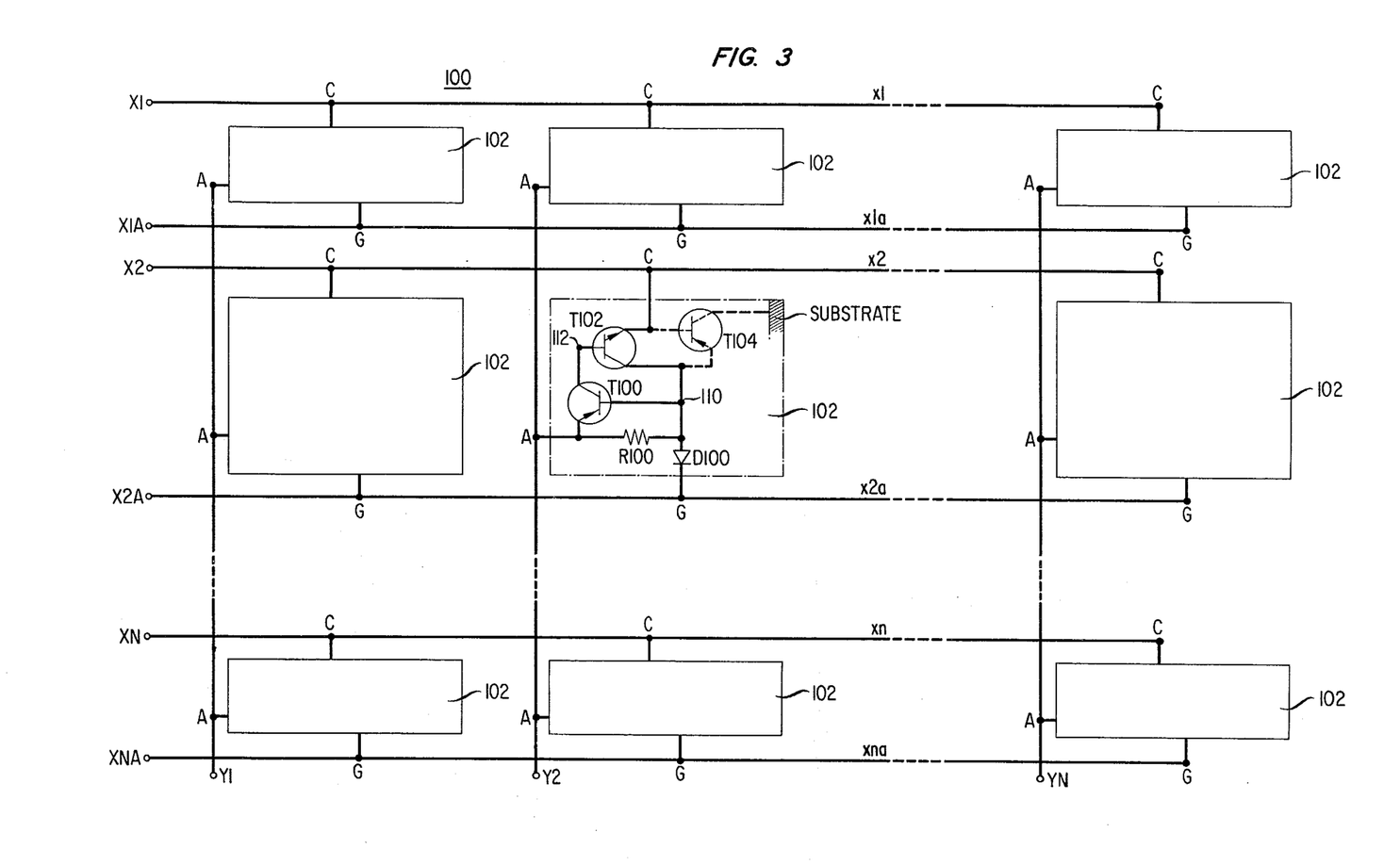
FIG. 3 illustrates an array of interconnected semiconductor crosspoint switches in accordance with the present invention.

Referring now to FIG. 3 there is illustrated an integrated circuit communication switching network 100 comprising an xy coordinate array of rows and columns of crosspoint switches 102. The array is arranged such that switches 102 interconnect at their intersections a plurality of x1 through xn selection conductors and a plurality of x1a through xna gate conductors with a plurality of y1 through yn selection conductors. Each of the conductors x1-xn has a separate one of input/output terminals X1-XN connected thereto. Each of the conductors x1a-xna has a separate one of gating terminals X1A-XNA connected thereto. Each of the conductors y1-yn has a separate one of input/output terminals Y1-YN connected thereto. All of the switches 102 and conductors x1-xn, x1a-xna, and y1-yn are typically fabricated on a single semiconductor silicon substrate.

All switches 102 are identical so only one is illustrated in detail. Each switch 102 comprises a p-n-p transistor T100, an n-p-n transistor T102, a diode D100, a resistor R100, and a parasitic transistor T104 (illustrated in dashed lines — the substrate serving as the collector of T104). The emitter of T100, a first terminal of R100, and an anode terminal A of each switch 102 of a given column of switches 102 are coupled together to the yn conductor associated with that column of switches 102. The cathode of each D100 of all switches 102 of a given row of switches is coupled to a gate terminal G, and to the xna conductor associated with that row of switches 102. The emitter of each T102 of a given row of switches 102 is coupled to a cathode terminal C and to the xn conductor associated with that row of switches 102. The second terminal of R100 is coupled to the anode of D100, the base of T100, the collector of T102, the emitter of T104, and node 110. The collector of T100 and the base of T102 are connected together to node 112.

Each of the crosspoint switches 102 acts as a silicon controlled rectifier (SCR) which has a low off capacitance and a large impedance ratio between its blocking and conducting states. Any selected yn conductor can be electrically connected to any selected xn row conductor by causing the crosspoint switch 102 located at the intersection of the selected conductors to be in the conducting state. A switch 102 is caused to assume the conducting state by applying an appropriate positive voltage to terminal A with less positive voltages applied to terminals G and C. This causes conduction through D100 and causes the emitter-base junction of the T100 of the selected switch 102 to become forward biased and thus permits conduction therethrough which sets the potential of the base of T102 such that the emitter-base junction of T102 is forward biased. This permits conduction through T102. Thus a conduction path between terminal A and C of selected switch 102 is established. Once a conduction path between terminals A and C is established, terminal G can be increased in potential such that current ceases to flow through D100. If conduction through a switch 102 ceases the low impedance electrical path therethrough becomes a high impedance path. Each switch 102 thus acts as a silicon controlled rectifier which has a large impedance ratio between its low impedance conducting state and the high impedance blocking state.

Selection circuitry (not illustrated) coupled to the XN, XNA, and YN terminals is used to select the switch 102 that connects the desired XN and YN terminals. DC power sources (not illustrated) coupled to the XN, XNA, and YN terminals are used to control and maintain the state of each switch 102.

After the desired XN and YN terminals have been electrically connected, AC or telephone voice signals can be superimposed on the DC current flow. This creates a bilateral communication path between the selected XN and YN terminals.

Leakage of signal currents from terminal C or node 110 into the substrate through parasitic transistor T104 causes the AC or voice signal to degrade. In large solid state electronic telephone switching systems the leakage of voice signals into the substrate must be typically kept to less than one part in $10^4$. The semiconductor configuration of the crosspoint switch 102 illustrated in FIG. 4 and discussed in detail below achieves this low leakage requirement.

Figure 4:
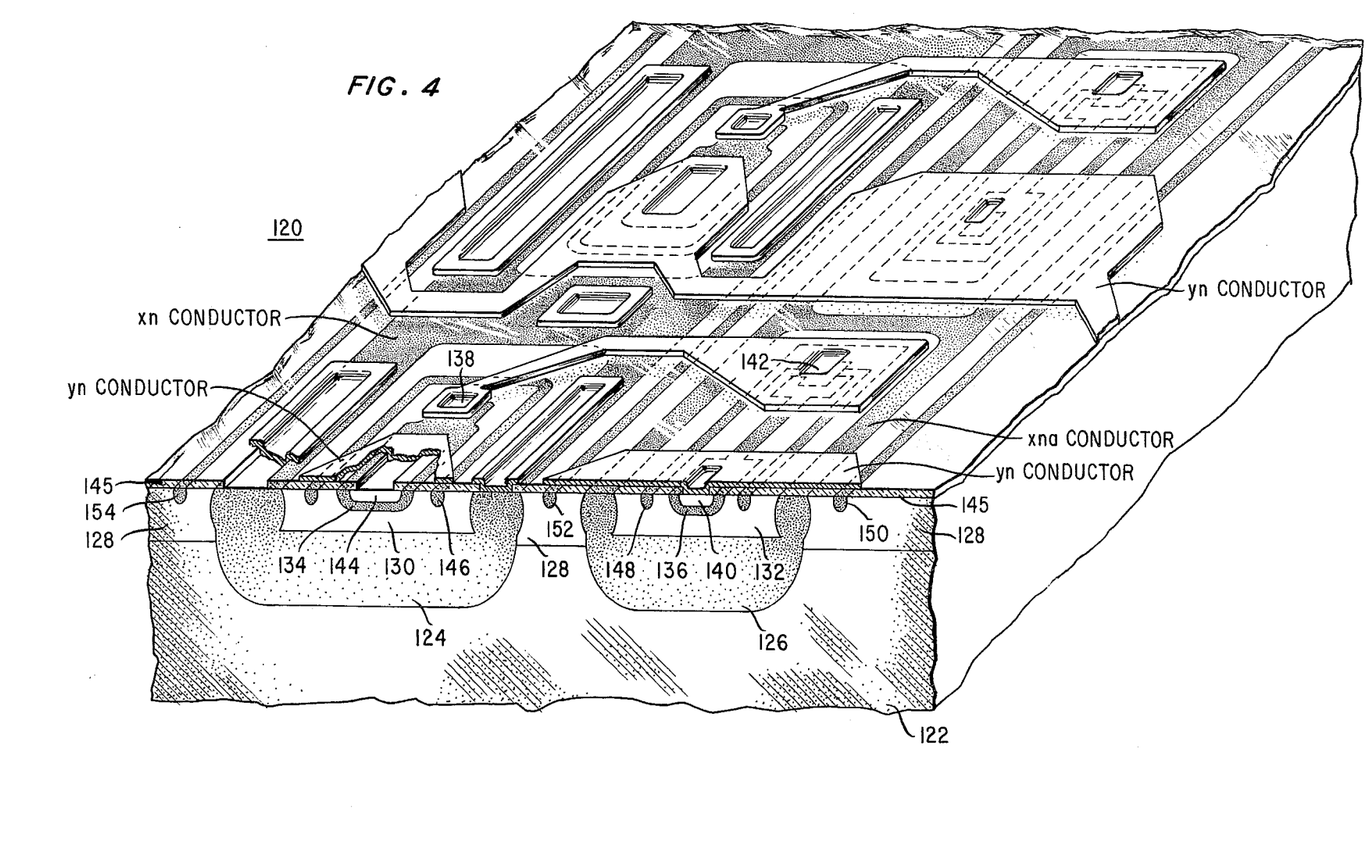
FIG. 4 illustrates in a perspective a front cross section view of a preferred semiconductor embodiment of a crosspoint switch of the array switches of crosspoint of FIG. 3.

Referring now to FIG. 4 there is illustrated in a perspective cross section view a preferred semiconductor structure 120 of part of the array of crosspoint switches 102 of FIG. 3. Semiconductor structure 120 comprises a p-type silicon substrate 122 on which the p-n-p, n-p-n, pn, and resistor components of crosspoint switch 102 are formed by well-known diffusion and ion implantation techniques as junction-isolated regions of semiconductor material.

Semiconductor structure 120 comprising a pair of n+ type longitudinal regions 124 and 126. Regions 124 and 126 are fabricated using a two step process. First, both are ion implanted and then diffused into the substrate 122 and then the substrate 122 is overlaid with a grown p-type epitaxial region 128. Next, n-type impurities are selectively deposited on the p-type epitaxial region 128 and then diffused to penetrate the region 128 to leave the original n+ type diffusion as buried regions with isolated regions of p-type material 130 and 132 surrounded by the n+ type layers 124 and 126, respectively. The 124 and 126 n+ type regions completely surround the p-type regions 130 and 132, respectively, on four sides and the bottom. Second n-type regions 134 and 136 are ion implanted within p-type regions 130 and 132, respectively. n+ type region 138 is diffused into part of n-type region 134 to allow a low resistance ohmic contact to be made to region 134. n+ type regions 140 and 142 are diffused into n-type region 136 to allow a low ohmic contact resistance to be made to both ends of n-type region 136, which serves as a resistor.

A layer of gold (not illustrated), typically 500–2000 Angstroms thick, is now applied to the back surface of substrate 122 and then a p+ type region 144 is diffused into part of n-type region 134. Separate p+ type regions 146 and 148 are diffused into p-type regions 130 and 132, respectively, as illustrated, to help limit inversion of the p-type regions 130 and 132 respectively. p+ type regions 150, 152, and 154 are diffused in region 128 on both sides of regions 124 and 126 to help prevent inversion of these p-type regions.

A layer of $SiO_2$ 145 is grown on the planar surface of substrate 122 and then using standard techniques appropriate contact windows are opened in the $SiO_2$ to expose the portions of the semiconductor structure 120 which are to be electrically contacted.

A passivating layer (not illustrated), typically of $Si_3N_4$, is then deposited over the substrate 122 to a typical thickness of 1000–2000 Angstroms. The original contact windows in the SiO$_2$ layer 144 are reopened and the substrate is subjected to a high temperature of typically 1100°-1150° C. in an ambient of nitrogen for 40-60 seconds and then the substrate 122 is quickly cooled to room temperature. This is known as a gold spike process. It serves to place the gold atoms in crystalline sites in all regions of a semiconductor portions of structure 120. These placed gold atoms serve as recombination centers that are much more effective in causing the recombination of carriers than naturally occurring recombination centers which exist in semiconductor material.

Metallization, including connections between n+ region 138, p+ region 148, and n+ region 142 and connections between n+ region 140 and p+ region 144, is then done.

Longitudinal n+ region 124 serves as the C terminal of switch 102 and as one of the low impedance xn conductors of the array 100 illustrated in FIG. 3. Longitudinal n+ region 126 serves as the G terminal of switch 102 and as one of the low impedance xna conductors of the array 100 illustrated in FIG. 3. The metallization connecting regions 140 and 144 serves as one of the crosspoint yn conductors of the array 100 of FIG. 3 and as the A terminal of switch 102.

Typically the thickness of regions 124, 130, 134, and 144 are 6-20 microns, 3-9 microns, 1-2 microns, and 1-3 microns, respectively. It is desirable that region 124 be relatively thick to provide carriers entering therein sufficient time to recombine and that region 124 be heavily doped such that there are relatively large numbers of naturally occurring recombination centers to facilitate recombination such that there is relatively low leakage of carriers from region 124 into the substrate 122. Region 124 is accordingly doped as highly as is reasonably possible, typically $10^{19}$/cm$^3$.

It is also desirable that region 130 be reasonably thick so as to allow some of the carriers existing therein sufficient time to recombine and thereby limit the number of carriers which travel from region 130 through region 124 and then into substrate 122 as leakage.

The gold doping step described above causes a large number of gold atoms to take positions within region 124 because n+ type regions have an affinity for collecting gold atoms. The gold atoms in region 124 are significantly more effective recombination centers than those recombination centers which naturally occur in region 124. These additional highly effective recombination centers significantly increase the recombination of carriers introduced into region 124 from region 130 and thus significantly further reduce leakage into the substrate.

It has been found that with relatively high current densities ($\sim 10^3$ A/cm$^2$) and without gold doping of any region, that leakage currents into the substrate are higher than one would expect for the impurity doping concentration levels used in regions 134, 130 and 124. It is believed that the high current densities in region 130 cause a plasma of carriers of equal numbers of holes and electrons to be created in p-type region 130 due to the effect known as conductivity modulation. The net excess of number of holes over the number of electrons in region 130 remains as it should be as a function of the impurity concentration thereof; however, once this plasma of charge reaches n+ type region 124 the holes of the plasma diffuse across region 124 and reach the junction of region 124 between 124 and the substrate 122 and are collected by the substrate 122 as leakage. The electrons tend to be repelled by the n+ type region 124 and tend to quickly drift into region 136.

It is believed that the gold doping of region 130 causes the high current density induced plasma of carriers to recombine in region 130 and thereby significantly reduces this plasma. Accordingly, the numbers of carriers available to diffuse through region 124 and into the substrates as leakage is significantly reduced. The gold doping of both regions 124 and 130 thus very significantly reduces leakage into the substrate 122.

A 4 by 8 array of 32 crosspoint switches 102, essentially as illustrated in FIG. 3, has been fabricated on a single silicon integrated circuit chip utilizing the structure 120 illustrated in FIG. 4. The semiconductor chip is approximately 79 square mils and is packaged in an 18 pin dual-in-line package. The equivalent conducting state resistance between the anode and cathode of a crosspoint switch 102 is typically 10 ohms with 10ma of current flow. The capacitance between terminals C and A when the crosspoint switch 102 is in the blocking state is typically one pF and the input impedance is typically $10^9$ ohms. The DC current passing through a conducting crosspoint switch 102 is typically 5 mA. Telephone voice signals applied to the C or A terminals of a crosspoint switch 102 are typically ± 3 mA. Typical leakage currents into the substrate with current flow of 10ma are less than 10 nA. R100 typically has a resistance of 1300 ohms.

The foregoing is to be considered merely illustrative of the inventive concepts. Various modifications within the spirit and scope of the invention are possible. For example, in n-type substrate can be used instead of a p-type substrate. The conductivity of all of the regions is accordingly reversed as are the power supply potentials needed for operation. Further, platinum atoms can be substituted for the gold atoms. Still further, additional recombination centers can be created in a semiconductor region by applying radiation to the region to deform parts of the structure thereof. Still further, ion implantation can be used to form regions which are described as being formed by diffusion or vice versa. Still further, the p-type epitaxial layer can be eliminated and a switch comprising four regions of alternating conductivity type can be formed directly in the substrate.

What is claimed is:

1. A low voltage, low current junction isolated integrated circuit thyristor for use in high density crosspoint arrays comprising:

a substrate comprising a bulk and an upper portion that are both of a first conductivity type the substrate being adapted to be electrically connected to a first bias operating voltage source;

a first region of a second conductivity type contained within portions of the bulk and upper portion of the substrate, the first region being adapted to be electrically connected to a reference bias operating voltage source, the first region being characterized in that a portion thereof extends completely through the upper portion of the substrate so as to completely isolate a portion of the upper substrate;

the isolated portion of the upper portion of the substrate defining a second region;

a third region of the same conductivity type as the first region and being contained in a portion of the second region;

a fourth region of the same conductivity type as the second region and being contained within a portion of the third region; the fourth region being adapted to be electrically connected to a second bias operating voltage source;

a background level of recombination centers in said first region; means for suppressing the current gain of the parasitic transistor formed by the substrate, the first region, and the second region comprising additional recombination centers in said first region in combination with sufficient vertical thickness and dopant concentration of said first region, and means for supplying said first, second, and reference bias operating voltage sources, the resulting leakage current associated with transistor action in the parasitic transistor is less than one part in ten thousand of the current conducted between the fourth and first regions.

2. The apparatus of claim 1 wherein the additional recombination centers of the first and second regions are gold atoms.

3. Apparatus of claim 1 wherein the additional recombination centers of the first and second regions are platinum atoms.

4. The apparatus of claim 1 wherein the additional recombination centers of the first and second regions are caused by radiation applied to the first and second regions.

5. The apparatus of claim 1 further comprising:

a fifth region of the opposite conductivity of the substrate and being contained within a portion of the substrate and being separated from the first region by a portion of the substrate;

a sixth region of the same conductivity type as the substrate and being conpletely contained within a portion of the fifth region;

a seventh region being of the same conductivity type as the fifth region and being wholly contained within a portion of the sixth region; and the seventh region comprising a resistor having a first end terminal area which is adapted to be electrically connected to the third region and having a second end terminal area which is adapted to be electrically coupled to the fourth region.

6. The apparatus of claim 5 wherein the sixth region being charaterized in that it comprises in addition to naturally occurring recombination centers, additional recombination centers which result in an increase in the breakdown voltage between regions five and six.

7. The apparatus of claim 5 wherein the substrate is of p-type conductivity and the first, second, third, fourth, fifth, sixth, and seventh regions are of n, p, n, p, n, p, and n-type conductivity, respectively;

8. An integrated circuit switching network comprising an array of crosspoint switches interconnecting x and y coordinate conductors, the switches including semiconductor devices having a conducting and a non-conducting state and being formed on a single substrate, each of the devices comprising a semiconductor device comprising:

a substrate comprising a bulk and an upper portion that are both of a first conductivity type, the substrate being adapted to be electrically connected to a first bias operating voltage source;

a first region of the opposite conductivity type contained within portions of the bulk and upper portion of the substrate, the first region being adapted to be electrically connected to a reference bias operating voltage source, the first region being characterized in that a portion thereof extends completely through the upper portion of the substrate so as to completely isolate a portion of the upper substrate;

the isolated portion of the upper portion of the substrate defining a second region;

a third region of the opposite conductivity type and being completely contained within a portion of the second region, a fourth region of the first conductivity type and being completely contained within a portion of the third region, the fourth region being adapted to be electrically connected to a second bias operating voltage source;

background level of recombination centers in said first region;

means for suppressing the current gain of the parasitic transistor formed by the substrate, the first region, and the second region comprising additional recombination centers in said first region in combination with sufficient vertical thickness and dopant concentration of said first region, and means for supplying said first, second, and reference bias operating voltage sources, the resulting leakage current associated with transistor action in the parasitic transistor is less than one part in ten thousand of the current conducted between the fourth and first regions;

a fifth region of the opposite conductivity type and being contained within a portion of the substrate and being separated from the first region by a portion of the substrate;

a sixth region of the first conductivity type and being completely contained within a portion of the fifth region;

a seventh region of the opposite conductivity type and being wholly contained within a portion of the sixth region; and the seventh region comprising a resistor having a first end terminal area which is electrically coupled to the third region and having a second end terminal area which is electrically coupled to the fourth region.

9. A low voltage, low current junction isolated integrated circuit thyristor for use in high density crosspoint arrays comprising:

a substrate of a first conductivity type having a first region contained therein which is of the opposite conductivity type, the substrate and the first regions being adapted to be electrically connected to a first and a reference bias operating voltage source respectively;

a second region of the opposite conductivity type of the first region and being contained in a portion of the first region;

a third region of the same conductivity type as the first region and being contained in a portion of the second region;

a fourth region of the same conductivity type as the second region and being contained within a portion of the third region, the fourth region being adapted to be electrically connected to a second bias operating voltage source;

a background level of recombination centers in said first region;

means for suppressing the current gain of the parasitic transistor formed by the substrate, the first region, and the second region comprising additional recombination centers in said first region in combination with sufficient vertical thickness and dopant concentration of said first region and means for supplying said first, second, and reference operating voltage sources, the resulting leakage current associated with transistor action in the parasitic transistor is less than one part in ten thousand of the current conducted between the fourth and first regions.

* * * * *

UNITED STATES PATENT AND TRADEMARK OFFICE
CERTIFICATE OF CORRECTION

PATENT NO. : 4,130,827

DATED : December 19, 1978

INVENTOR(S) : Frederick A. D'Altroy, Adrian R. Hartman, Richard M. Jacobs, Robert L. Pritchett, and Peter W. Shackle It is certified that error appears in the above-identified patent and that said Letters Patent are hereby corrected as shown below:

Column 7, line 7, after "in all regions of" delete "a".
Column 7, line 67, after "between" insert --region--.
Column 10, line 14, insert --a-- before "background".
Column 11, line 1, delete "and" insert --, the--.

Signed and Sealed this

Fifth Day of June 1979

[SEAL]

Attest:

RUTH C. MASON
Attesting Officer

DONALD W. BANNER
Commissioner of Patents and Trademarks

UNITED STATES PATENT AND TRADEMARK OFFICE
CERTIFICATE OF CORRECTION

PATENT NO. : 4,130,827
DATED : December 19, 1978
INVENTOR(S) : Frederick A. D'Altroy, et al It is certified that error appears in the above-identified patent and that said Letters Patent are hereby corrected as shown below:

Column 7, line 7, after "in all regions of" delete "a".

Column 7, line 67, after "between" insert --region--.

Column 10, line 14, insert --a-- before "background".

THIS CERTIFICATE SUPERSEDES CERTIFICATE OF CORRECTION ISSUED June 5, 1979.

Signed and Sealed this

Second Day of October 1979

[SEAL]

Attest:

RUTH C. MASON
Attesting Officer

LUTRELLE F. PARKER
Acting Commissioner of Patents and Trademarks